(12) United States Patent
Nucci et al.

(10) Patent No.: US 7,558,290 B1
(45) Date of Patent: Jul. 7, 2009

(54) METHOD AND APPARATUS OF DATA COMPRESSION FOR COMPUTER NETWORKS

(75) Inventors: Antonio Nucci, Burlingame, CA (US); Su Chen, Somerset, NJ (US)

(73) Assignee: Narus, Inc., Sunnyvale, CA (US)

( * ) Notice: Subject to any disclaimer, the term of this patent is extended or adjusted under 35 U.S.C. 154(b) by 610 days.

(21) Appl. No.: 11/303,651

(22) Filed: Dec. 16, 2005

(51) Int. Cl.
*H04J 3/18* (2006.01)
(52) U.S. Cl. .................................... 370/477
(58) Field of Classification Search ................. 370/477, 370/522, 464, 498, 465, 521, 532, 535, 537, 370/538, 540, 543, 544, 545; 375/240; 348/384.1
See application file for complete search history.

(56) References Cited

U.S. PATENT DOCUMENTS 5,805,600 A * 9/1998 Venters et al. .............. 370/477
6,320,594 B1 * 11/2001 Young ........................ 345/605
6,731,812 B2 * 5/2004 Bailleul ...................... 382/239

OTHER PUBLICATIONS

Antonio Nucci, et al.; "Group Compression for IP flow logs"; 8 pgs.

* cited by examiner

*Primary Examiner*—Chi H Pham
*Assistant Examiner*—Alexander Boakye
(74) *Attorney, Agent, or Firm*—Fernandez & Associates, LLP

(57) ABSTRACT

An important component of network monitoring is to collect traffic data which is a bottleneck due to large data size. We introduce a new table compression method called "Group Compression" to address this problem. This method uses a small training set to learn the relationship among columns and group them; the result is a "compression plan". Based on this plan, each group is compressed separately. This method can reduce the compressed size to 60%-70% of the IP flow logs compressed by GZIP.

2 Claims, 5 Drawing Sheets

METHOD AND APPARATUS OF DATA COMPRESSION FOR COMPUTER NETWORKS

BACKGROUND

1. Field

The present invention relates to computers. More particularly, the present invention relates to method and apparatus of data compression for computer networks.

2. Description of Related Art

Network traffic data collection is important for network measurements. Efficient measurements are critical to further network researches, like traffic engineering, intrusion detection and network topology modeling. However network data collection is difficult in high speed links because of large data volumes. Data compression is an effective method to overcome this difficulty. This is not only because data compression can reduce the storage space, but also because it can increase the link efficiency in transmission, and improve the performance of on-line traffic monitors. More details can be found in Gianluca Iannaccone, Christophe Diot, Ian Graham, Nick McKeown, Monitoring very high speed links, In Proc. of the 1st ACM SIGCOMM Workshop on Internet Measurement, 2001, V. Jacobson, Compressing TCP/IP headers for low-speed serial links, RFC 1144, Network Information Center, SRI International, Menlo Park, Calif., February, http://rfc.dotsrc.org/rfc/rfc1144.html, and also M. Degermark, B. Nordgren and S. Pink, IP Header Compression, RFC 2507, http://rfc.dotsrc.org/rfc/rfc2507.html, 1999. There are two major goals in designing a good compressor for network traffic data.

(1) High compression ratio: Compression method has to deal with very large data-sets. Network traffic data is huge. For example, in backbone, one hour collection of TCP/IP header on a 10 Gb/s link can easily reach 3 Tb. Disk and memory space become a major concern. Compression has to be fast.

(2) Low compression time: Some of the compressors are installed on network monitors. The high arrival rate of packets leaves very short time for the compressor to work. A lot of work has been done on compressing traffic data. The popular one is RFC TCP/IP header compression. More detail can be found in V. Jacobson, Compressing TCP/IP headers for low-speed serial links, RFC 1144, Network Information Center, SRI International, Menlo Park, Calif., February, http://rfc-.dotsrc.org/rfc/rfc1144.html and also M. Degermark, B. Nordgren and S. Pink, IP Header Compression, RFC 2507, http://rfc.dotsrc.org/rfc/rfc2507.html, 1999. For low-speed serial links, because most packet sizes are small, the line efficiency is very bad. Line efficiency is defined as the ratio of the data to header plus data in a packet. For example, for 1 byte data, we still need 40 byte TCP/IP header to transmit it. Prior work tries to reduce transmission bandwidth or latency by improving the line efficiency. For example, this is done by replacing the header with the connection index the packet belongs to. This can reduce the header size to as small as 3 bytes. Another goal for traffic data compression is to reduce the storage space. Because there is a lot of similarities between the consecutive packets belong to the same flow. Flow-based TCP/IP header compression has become popular in traffic data compression. More details can be found in R. Holanda, J. Garcia, A New Methodology for Packet Trace Classification and Compression Based on Semantic Traffic Characterization, ITC19, 2005, Raimir Holanda, Javier Verdu, Jorge Garcia, Mateo Valero, Performance Analysis of a New Packet Trace Compressor based on TCP Flow Clustering, ISPASS 05, 2005, Gianluca Iannaccone, Christophe Diot, Ian Graham, Nick McKeown, Monitoring very high speed links, In Proc. of the 1st ACM SIGCOMM Workshop on Internet Measurement, 2001, and also Yong Liu, Don Towsley, Jing Weng and Dennis Goeckel, An Information Theoretic Approach to Network Trace Compression, UMass CMPSCI Technical Report 05-03. Although these methods fully studied the information redundancy between traffic records on header-level, flow-level, and even spatial-level (records on different monitors), they ignore the structure inside the record. Group compression focuses on this structure. It can be applied to compression on any level. Group compression treats the traffic records as a table. Table compression was first introduced by Buchsbaum et al.; they find the best partition of the columns on either original column sequence or re-ordered columns each partition is compressed separately. More details can be found in Glenn Fowler, Adam Buchsbaum and Don Caldwell and Ken Church and S. Muthukrishnan, Engineering the Compression of Massive Tables An Experimental Approach, In Proc. 11th ACM-SIAM Symp. on Discrete Algorithms, pp. 175-184, 2000, and also Glenn Fowler, Adam Buchsbaum and Raffaele Giancarlo, Improving Table Compression with Combinatorial Optimization, In Proc. 13th ACM-SIAM Symp. on Discrete Algorithms, pp. 213-22, 2002. They use heuristics to find the order of the columns. However these heuristics considers only the pair-wise relationship between the columns, which is not accurate for the total ordering of columns in the partition. Spartan is another approach that divides the table into predictive and predicted columns. More information regarding Spartan can be found in S. Babu, M. N. Garofalakis, and R. Rastogi, Spartan: A model based semantic compression system for massive data tables, In Proc. of ACM SIGMOD Int'l Conference on Management of Data, 2001, and also M. Garofalakis and R. Rastogi, Data Mining Meets Network Management The Nemesis Project, ACM SIGMOD Int'l Workshop on Research Issues in Data Mining and Knowledge Discovery, May 2001. They compress predictive columns only while the predicted columns are derived from predictive columns. The method is good for detecting and using functional dependence in database table for lossy compressions, because some error tolerance can increase the number of columns that are predicted and therefore result in better compression. But for the lossless compression of IP traffic data, the number of columns that can be predicted is very limited. Still, it does not consider the combined relationship between a set of columns like we do. Fascicles and ItCompress explore the relationships between rows as well. More details can be found in H. V. Jagadish, J. Madar, Raymond T. Ng, Semantic Compression and Pattern Extraction with Fascicles, Proc. of VLDB, pp.: 186-198, 1999 and also H. V. Jagadish Raymond T. Ng Beng Chin Ooi Anthony K. H. Tung, ItCompress: An Iterative Semantic Compression Algorithm, ICDE, 04. This is not suitable for on-line compression since the algorithms need to scan all the rows before deciding how to compress. It has to wait for enough data to be collected. Accordingly, there is a need for a compression method and apparatus for compressing network data that takes advantage of the structural similarity in various aspects of computer network data to achieve high compression ratio and fast performance.

SUMMARY OF THE INVENTION

We propose a compression method called group compression to address these challenges that satisfies these two major goals. In an example embodiment of the present invention, the size of group-compressed data is only 60%-70% of their compressed size using GZIP. The GZIP stands for GNU zip, which is a common data compression technique well known to those skilled in the art of computers. More details can be found in http://www.gzip.org/. In an example embodiment of the present invention, the collected IP traffic data is formatted as a table of rows and columns before they are compressed. Each row has a fixed size based on the selection of network data to be collected. Column size varies depending on the amount of data collected before they are compressed as a table. Additional data collected after each compression are formatted in to a table before they are compressed. A compression plan is generated that describes which columns can be compressed well together based on a sub-set of data collected during a limited time interval called training time period. Data is then compressed in an on going basis according to the compression plan. The grouping of columns are reversed during de-compress process to recover original data. The compression can be done every row by itself (each time network data is collected), every so many rows, or at periodic intervals. The general compressors, like GZIP, ignore these relationships between columns of the data. So group compression in the present invention can achieve 30%-40% improvements over GZIP compressed size. Group compression fits on-line monitoring systems. Generating compression plan is the most time-consuming part of the algorithm; however this can be done off-line periodically. Once we have the compression plan, the compression time is mainly decided by the underlying compressor. In an example embodiment of the present invention, data collected in a training time period, called training set, is used to learn the preferred grouping of the columns for generating a compression plan. For most well-behaved data, a small training set can lead to a good stable compression plan. More details can be found in training can be done off-line, even if the training time is large, the on-line compression time will not be affected. This makes the algorithm suitable for on-line monitoring system. The present invention can apply to any computer data which are collected over time that have certain structural similarity among them. In one preferred embodiment of the present invention illustrated as an example, we will focus on reducing storage space for large IP traffic logs where IP traffic log is an example of computer data which are collected over time that have certain structural similarity among them. In order to study the efficiency of group compression, we build our table by extracting sample fields from IP flow logs. Our example table contains six fields namely "timestamp, source IP, destination IP, number of bytes in this packet" from IP header, and "source port number, destination port number" from TCP header. The table can be either ASCII version, binary version, hex version, or other similar format. For ASCII version, if some fields have different length, we pad them into equal length. The following is an example of what an ASCII table file looks like:

17:56:18.196926 192.168.0.40 192.168.1.30 43493 smtp 189

17:56:18.202044 192.168.1.30 192.168.0.40 43493 smtp 0##

17:56:18.891961 192.168.1.30 192.168.0.20 1754 telnet 0#

17:56:19.271001 192.168.0.20 192.168.1.30 1754 telnet 16

This example includes 4 rows of header information. The time stamp field includes 15 columns, the source IP field includes 12 columns, the destination IP field includes 12 columns, number of bytes in this packet field includes 5 columns in the first two rows and 4 columns in the second two rows, source port number field includes 4 columns in the first two rows and 6 columns in the second two rows, destination port number field includes 3 columns in the first row, 1 column in the second and third rows, and 2 columns in the fourth row. To pad these 4 rows into equal length, 2 padding characters are added for the second row and 1 padding character is added for the third row. Here # represents the padding character in this example. In this example where 8 bit ASCII is used for the format, each 8 bits of data in each row of extracted sample fields from IP flow logs is aggregated into a column element. The present invention applies to any number of bits aggregated for forming a column element, including but not limited to single bit, nibble, byte, word, long word, etc.

We introduce a formal definition of group compression on IP traffic data as follows. Let T be the table that needs to be compressed. T has n columns. Let C(T) be the number of compressed column elements of T. The goal is to partition the n columns into $G_1, \ldots, G_K$ ordered groups, each group $G_i$ containing $k_i$ columns in a given order, $T = U_{i=1}^{K} G_i$, and $\Sigma_{i=1}^{K} k_i = n$, so that compressed size $C(T) = \Sigma_{i=1}^{K} C(G_i)$ is minimized. Because most tables are not randomly generated, some columns are related to each other. So by grouping those columns together, we can get better compression ratio than general compressors. The best groups can be found by first computing permutations of all columns, then using dynamic programming to find the optimal partition of the columns. More details can be found in Glenn Fowler, Adam Buchsbaum and Don Caldwell and Ken Church and S. Muthukrishnan, Engineering the Compression of Massive Tables: An Experimental Approach, In Proc. 11th ACM-SIAM Symp. on Discrete Algorithms, pp. 175-184, 2000, and also Glenn Fowler, Adam Buchsbaum and Raffaele Giancarlo, Improving Table Compression with Combinatorial Optimization, In Proc. 13th ACM-SIAM Symp. on Discrete Algorithms, pp. 213-22, 2002. There are multiple optimal answers since if $G_1, \ldots, G_K$ is the best grouping for table T, then any permutation of $G_1, \ldots G_K$ will be best grouping too. For compression purpose only, it is not necessary to find all of such grouping.

BRIEF DESCRIPTION OF DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the present invention may admit to other equally effective embodiments.

DETAILED DESCRIPTION OF THE INVENTION

Figure 1:
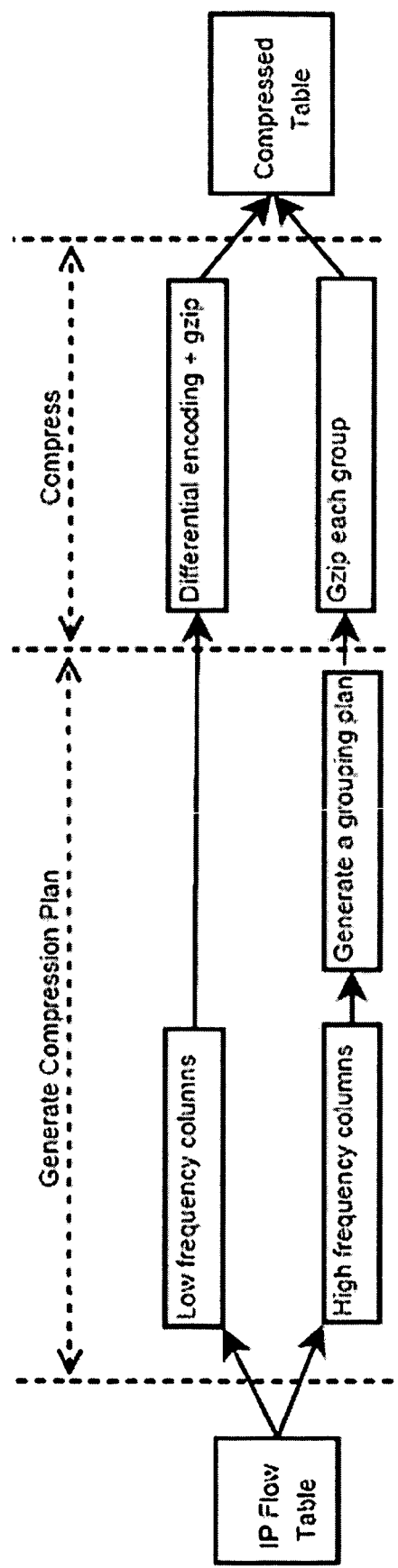
FIG. 1 is a diagram illustrating the group compression method according to an embodiment of the present invention.

FIG. 1 is a block diagram illustrating the group compression method according to an embodiment of the present invention. Here we assume the structural similarity of the collected data set can be represented by a small subset. We study a small subset of data collected in a training time period as the "training set" to determine a compression plan. First we separate the high-frequency and low-frequency columns of the training set based on how many data changes in the columns. What is important is the approach of separating the high-frequency and low-frequency columns in the present invention. A person skilled in the art will recognize the criteria for data change can be determined according to trade offs relating to compression ratio and compression time. For low-frequency columns, the data value does not change very often; these are compressed by differential encoding followed by GZIP. The differential encoding computes the difference of current byte and previous byte; it modifies the low-frequency columns into a sequence of 0 dominated columns. The group compression algorithm runs on high-frequency columns in the small training set. First it computes the compressed size for all candidate groups. Then it generates a compression plan by choosing the particular grouping that resulted in the smallest compressed size. This grouping reflects the structural similarity of the high-frequency columns. At compression step, we re-arrange the order and grouping of the columns according to the group compression plan and uses GZIP to compress each chosen group. Because the computational cost to find the best groupings is high, we limit our search to equal width groups in the example embodiment of the present invention. This means all candidates groups contain the same number of columns. The present invention applies to variable size grouping. Additional embodiments of the present invention uses variable size grouping to achieve better compression ratio at the expense of longer training time for calculating more candidate groups. In the example embodiment of the present invention using fixed size grouping, the algorithm can be summarized as follows.

(1) Generate Compression Plan Using Training Set Collected During a Training Time Period Separate high-frequency columns from low-frequency columns; let $n_f$ be the number of high-frequency columns.

For a user given group size of k columns, generate all possible grouping combinations of $n_f$ frequent columns. In each of the combinations, all permutations of k columns for each group are evaluated. For all $k! \times C_{n_f}^k$ candidate groups, compute the compressed size for each of them. Here k! is a mathematical expression representing factorial of k which is the number of permutations from k items. $C_{n_f}^k$ is a mathematical expression representing the number of groups, each of size k, resulted from all possible grouping combinations of total $n_f$ items.

Use compressed size divided by number of columns in the group as the score for the group, apply Chvatal's greedy set covering algorithm to compute the min set cover as the chosen grouping combination that defines the compression plan. Here min set cover is a common term well known to a person skilled in the graph theory and is understood to mean the grouping combination that results in a minimum score. More detail regarding Chvatal's greedy set covering algorithm can be found in Vasek Chvatal, A greedy heuristic for the set covering problem, Mathematics of Operations Research, vol. 4, no. 3, pp. 233-235, 1979.

(2) Online Compression

For low-frequency columns, compress them with differential encoding in combination with the GZIP.

For high-frequency columns, compress each chosen group with GZIP.

In this example embodiment of the present invention, the online compression is done one row at a time as network data are collected; therefore the table has only one row. The present invention applies to other arrangements, e.g. certain number of rows of network data can be buffered to create a table of fixed number of rows before applying the compression according to the compression plan, or certain time period can be set where network data is buffered to create a table of variable number of rows before applying the compression according to the compression plan, etc; after a table is compressed additional network data are collected to form the next table and so on and so forth. What is important is the approach illustrated in the algorithm of the example embodiment of the present invention to separate the high-frequency and low-frequency columns and to generate a compression plan using a training set. Any other algorithms can be incorporated into the system, e.g. the score can be formulated as compressed size squared divided by number of columns in the group, Chvatal's greedy set covering algorithm can be substituted with other appropriate algorithm, etc. What is important is the approach illustrated in the example embodiment of the present invention which can be implemented as hardware, firmware, software, or combination thereof, and can be implemented as stand alone device or a computer network wherein the network can be wired or wireless. The example embodiment does not limit the scope of the present invention.

Figure 2:
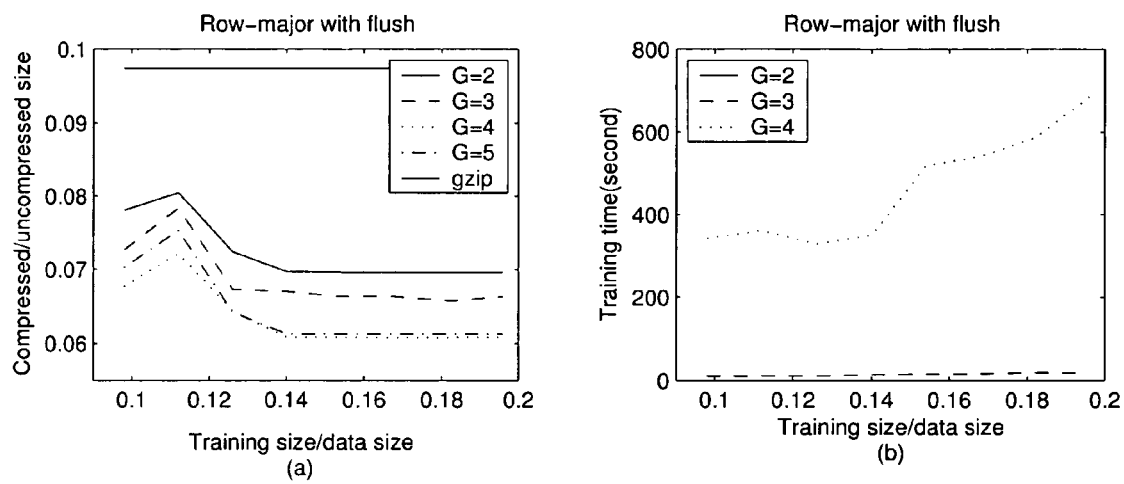
FIG. 2 is a chart illustrating group compression size and time according to an embodiment of the present invention.

FIG. 2 is a chart illustrating group compression size and time according to an embodiment of the present invention. Our experiment is done on Linux Fedora machine with 2.80 GHz processor and 2047M B memory. Our input table is extracted from the TCP and UDP packets in the network traffic data from the Lincoln Laboratory http://www.ll.mit.edu/IST/ideval/data/data\_index.html. We use the first week as training data in 1998 data set. Group compression can save 30%-40% more on data compressed by GZIP. In FIGS. 2a and 2b the original table size is 1.086M, the group compressed size range from 66.021K to 87.366K, and the GZIPed size is 105.75K. Let compression ratio be Compressed size/Original table size. FIG. 2a compares the compression ratio for different training sizes. Here training size is the size of training set or the amount of data used to generate the compression plan, the data size is the total amount of data to be compressed. The GZIP is a horizontal line because it has no training. The table formed from IP flow logs has lot of repetitions in it, like port number "ftp", "telnet", so GZIP achieves pretty good compression ratio 9.74%. The compressed size decreases with group size increases, but it reaches a stable state eventually. After that the compressed size will not change too much with the group size. In FIG. 2a, the group size G=4 (group size of 4 columns) and G=5 (group size of 5 columns) lead to similar compressed size. The reason is that the best grouping plan can not contain all large groups. Most groups size are around average. When the algorithm reaches this average value, it has found most of the good groups, so that the compressed size can not be improved easily anymore. FIG. 2b shows the corresponding training times. The plot is based on average time calculated from 5 runs. The training time for G=2 is less than 1 second: it is the line on the bottom. The training time increases to 10-20 seconds for G=3, and jump to 300-700 seconds for G=4. The training time grows linearly with training size, but exponentially with group size. The Linux Fedora machine with 2.80 GHz processor and 2047M B memory used for these data is an example of the present invention. The compression ratio and compression time achieved is for illustrating the present invention. What is important is the approach illustrated in the example embodiment of the present invention which can be implemented as hardware, firmware, software, or combination thereof, and can be implemented as stand alone device or a computer network wherein the network can be wired or wireless. The compression ratio and compression time may vary as a result of the actual configuration of an embodiment of the present invention. The example embodiment does not limit the scope of the present invention.

Figure 3:
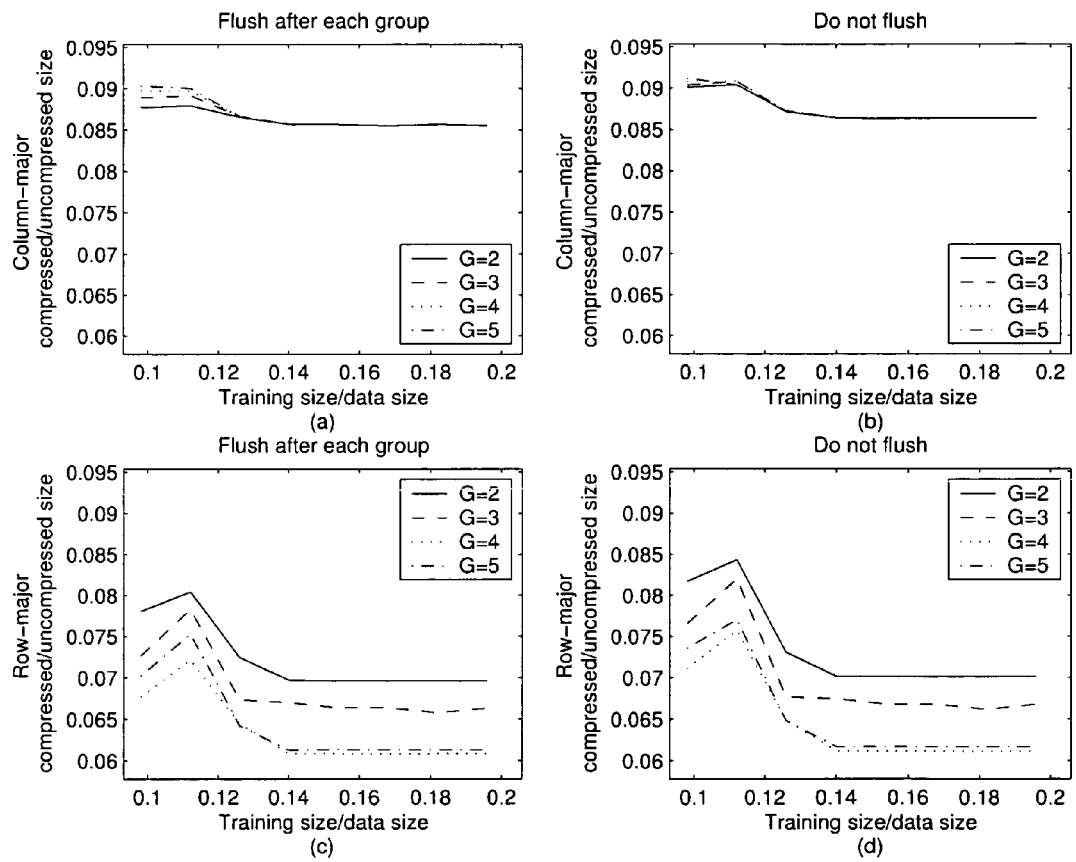
FIG. 3 is a chart comparing implementation details according to an embodiment of the present invention.

FIG. 3 is a chart comparing implementation details according to an embodiment of the present invention. Although the training time is large, note that it is an off-line process. It may still be worth to spend a couple of hours to find a good plan that can be used for days. The compression size is affected by some implementation details too, like whether the compression is done column wise or row wise, whether the ZLIB is flushed after compressing each group, etc. Here ZLIB is a term well know to a person skilled in the art of data compression and is understood to mean a memory resident library of GZIP. FIG. 3 shows the comparison: x-axis is the training size divided by data size (compression ratio), and y-axis is the compression ratio.

(a) is column-major compression with flush after compressing each group.

(b) is column-major compression without flush.

(c) row-major compression with flush after compressing each group.

(d) row-major compression without flush.

The column-major compression (b) without flush is worst case, and row-major compression (c) with flush is the best one. The row-major or column-major makes big difference on compression result, while flush or not flush does not. For on-line compression, row-major is preferred. Because column-major need the compressor to store the data first before compressing. This is not practical in most cases.

Figure 4:
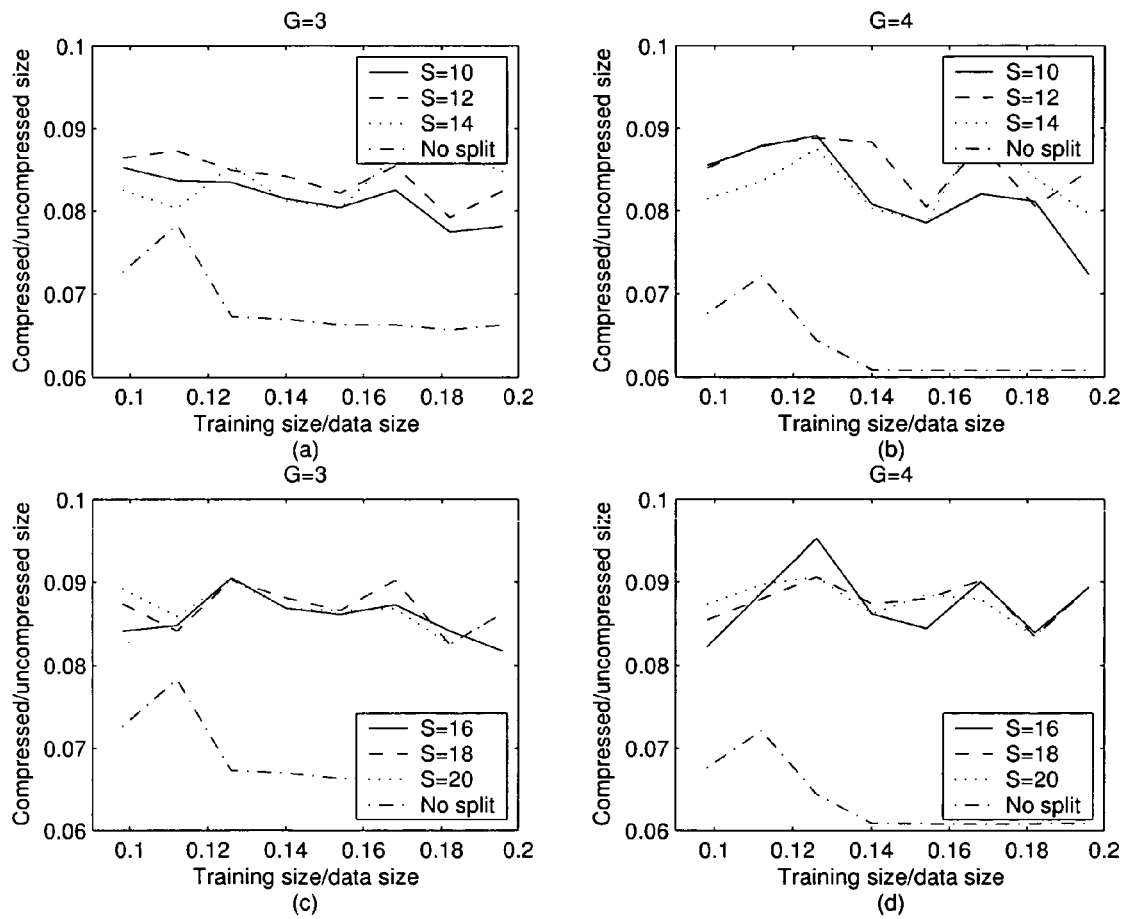
FIG. 4 is a chart comparing compression size for splitting according to an embodiment of the present invention.
Figure 5:
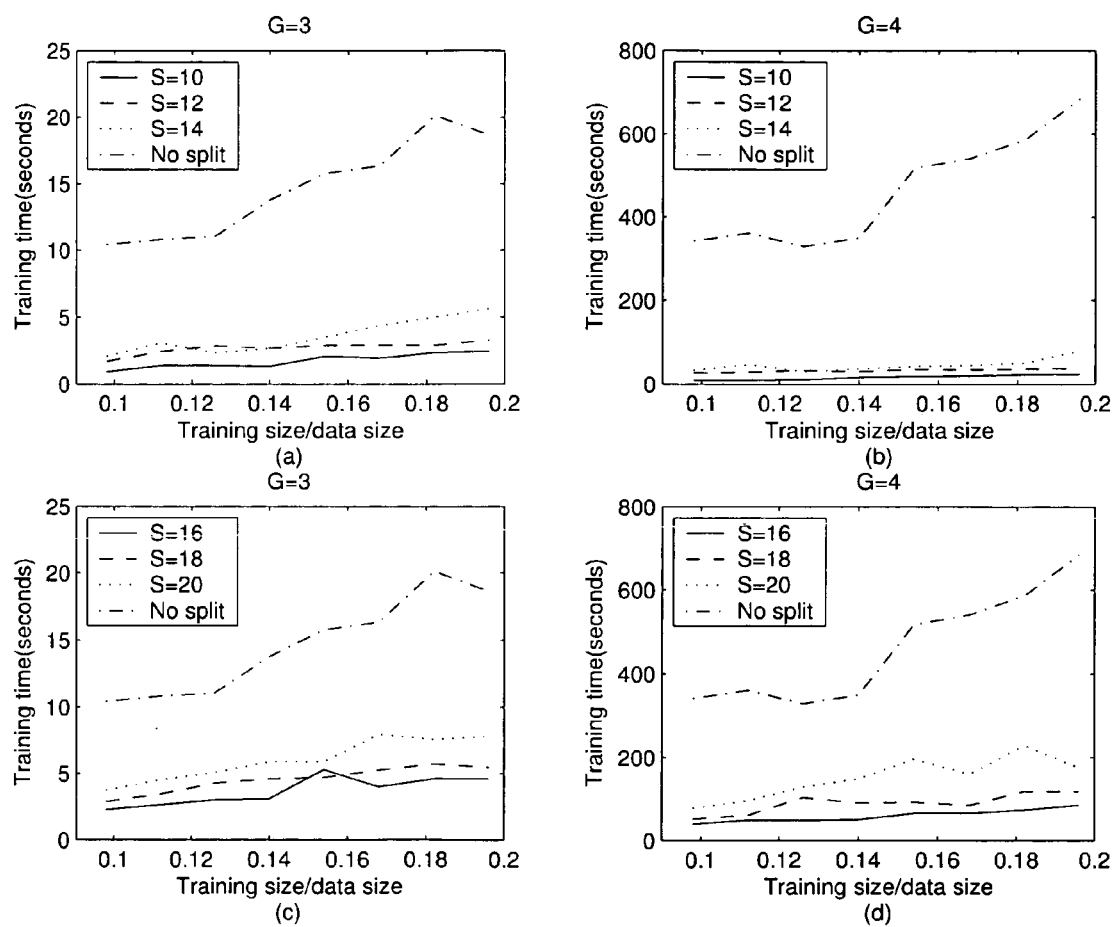
FIG. 5 is a chart comparing running time for splitting according to an embodiment of the present invention.

If $n_f$ is large, the training time will be huge. We split the high frequency columns into several intervals, and apply group compression algorithm on each interval separately. In an example embodiment of the present invention using the example table of sample fields from IP flow logs, This will increase the compressed size a little, but save a lot of time on training with large group size. FIG. 4 is a chart comparing compression size for splitting the high frequency columns into several intervals according to an embodiment of the present invention. FIG. 5 is a chart comparing running time for splitting the high frequency columns into several intervals according to an embodiment of the present invention. Running time is the sum of training time from all split intervals to produce the compression plan. As we can see the running time increases dramatically when group size is increased from 3 columns (G=3) to 4 columns (G=4). A tradeoff to keep the cost low is to split the high frequency columns into small intervals, and apply group compression algorithm on each interval. In FIG. 4 the high frequency column number $n_f$ ranges from 25 to 27 depend on the training set size. We re-order the high frequency columns according to the compression plan, and divide them into intervals with length S (S number of columns), the last interval length will the $n_f$ % S (the remainder of $n_f$ divided by S). The compression performance of "splitting" decreases a little compared to "No splitting" as can be seen in FIG. 4 but the running time is much smaller, in particular for large group size as can be seen in FIG. 5. For group size G=4, the compressed ratio decreases 2%-3%, while the compression time is 200-500 seconds less. For dynamic data that needs frequent training, "splitting" is a good choice. This method sacrifices a little compression ratio, but saves a lot in training time, as result reducing the total running time.

Foregoing described embodiments of the invention are provided as illustrations and descriptions. They are not intended to limit the invention to precise form described. In particular, it is contemplated that functional implementation of invention described herein may be implemented equivalently in hardware, software, firmware, and/or other available functional components or building blocks, and that networks may be wired, wireless, or a combination of wired and wireless. Other variations and embodiments are possible in light of above teachings, and it is thus intended that the scope of invention not be limited by this Detailed Description, but rather by Claims following.

The invention claimed is:

1. A method for compressing computer network data comprising the steps of: formatting the computer network data into a data structure comprising one or more element; defining a compression plan based on a training set of the computer network data: and compressing by a compressor, the computer network data according to the compression plan, wherein the compression plan comprises one or more group of the one or more element, wherein the data structure comprises a table, the element comprises a column of the table, and the training set comprises one or more row of the table, and wherein the defining a compression plan step further comprises the step of applying a set covering algorithm to the training set for computing one or more min set cover for one or more interval of the training set wherein the one or more interval of the training set comprises one or more column.

2. A method for compressing computer network data comprising the steps of: formatting the computer network data into a data structure comprising one or more element; defining a compression plan based on a training set of the computer network data; compressing by a compressor, the computer network data according to the compression plan, wherein the compression plan comprises one or more group of the one or more element, and categorizing the one or more element into a first category and a second category, wherein one or more element in the first category is compressed with a first compression algorithm and one or more element in the second category is compressed with a second compression algorithm in the compressing the computer network data step, wherein the data structure comprises a table, the element comprising a column of the table, the training set comprising one or more row of the table, each of the one or more group comprising one or more column corresponding to the first category, the first compression algorithm comprising a group compression using GZIP, the second compression algorithm comprising a differential encoding and GZIP.

* * * * *